(12) United States Patent
Tanaka (10) Patent No.: US 8,385,752 B2
(45) Date of Patent: Feb. 26, 2013

(54) LASER DIODE DRIVER WITH BACK TERMINATOR AND OPTICAL TRANSMITTER PROVIDING THE SAME

(75) Inventor: Keiji Tanaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 385 days.

(21) Appl. No.: 12/689,827

(22) Filed: Jan. 19, 2010

(65) Prior Publication Data

US 2010/0183318 A1 Jul. 22, 2010

(30) Foreign Application Priority Data

Jan. 20, 2009 (JP) ................................ 2009-009965

(51) Int. Cl.
*H04B 10/12* (2006.01)
(52) U.S. Cl. .................... 398/201; 398/193; 398/200
(58) Field of Classification Search ........... 398/182–201
See application file for complete search history.

(56) References Cited

U.S. PATENT DOCUMENTS

| | | | |
|---|---|---|---|
| 6,542,008 B1 | 4/2003 | Daugherty et al. | |
| 6,958,840 B2 * | 10/2005 | Tsai ............................... | 359/237 |
| 6,965,722 B1 | 11/2005 | Nguyen | |
| 7,181,100 B2 * | 2/2007 | Douma ........................... | 385/14 |
| 7,483,459 B2 * | 1/2009 | Uesaka et al. ............. | 372/38.02 |
| 2009/0268767 A1 * | 10/2009 | Nelson ....................... | 372/38.02 |

OTHER PUBLICATIONS

ISSCC 2005, Session 12, Optical Communications/ 12.1, pp. 220, 221 and 594.
"Broadband Circuits for Optical Fiber Communication", Wiley International Science, pp. 273-275, 2005.

* cited by examiner

*Primary Examiner* — Dzung Tran
(74) *Attorney, Agent, or Firm* — Smith, Gambrell & Russell, LLP (57) ABSTRACT

An LD-Driver with a back termination circuit is disclosed. The back termination circuit of the invention provides a transistor as an active device, a current source to provide a bias current to the transistor, and a resistor as a passive element that couples the transmission lines carrying a differential signal thereon. Because the transistor shows a differential resistance of several tens of ohms by providing only a few milli-amperes, the output impedance of the LD-Driver may be substantially matched with the characteristic impedance of the transmission line with lesser additional power consumption.

16 Claims, 7 Drawing Sheets

LASER DIODE DRIVER WITH BACK TERMINATOR AND OPTICAL TRANSMITTER PROVIDING THE SAME

BACKGROUND OF THE INVENTION

1. Field of the Invention

The present invention relates to a laser diode driver (hereafter denoted as LD-Driver) that drives a semiconductor laser diode (hereafter denoted as LD), and an optical transmitter providing the LD-Driver.

2. Related Prior Art

An ordinary LD applicable to the optical communication system has a differential resistance of 5 to 10Ω. Such an LD is enclosed within a coaxial CAN package and driven by the LD-Driver by being provided with a driving current thorough a transmission line formed on, for instance, a flexible printed circuit board and a rigid circuit board. Because a distance between the LD-Driver and the LD is a few tens of millimeters, the driving signal degrades due to the signal reflection between the transmission line and the LD or between the transmission line and the LD-Driver as the transmission rate of the optical communication becomes faster.

Various prior arts have reported the back termination circuit to reduce the back reflection caused by the impedance mismatching between the transmission line and the LD-Driver. However, such back termination circuits disclosed in the prior arts provides only a resistor connected between two outputs of the LD-Driver or between the output of the LD-Driver and the power supply. Such configurations shunt the driving current to be provided to the LD, which increases the power consumption of the LD-Driver. Another back termination circuits temporarily creates a replica signal whose magnitude and phase are comparable to the driving signal. However, the circuit to create the replica signal enlarges the size of the LD-Driver, which also increases the power consumption of the LD-Driver, and makes it hard to lower the power supply voltage.

The back termination circuit according to the present invention suppresses the degradation of the driving signal due to the signal reflection at the outputs of the LD-Driver with less increment of the power consumption.

SUMMARY OF THE INVENTION

One aspect of the present invention relates to an LD-Driver that provides a driving current to an LD implemented in a transmitter optical subassembly. The LD-Driver of the invention comprises a pair of output terminals and a back terminator. Each of the output terminals outputs the driving current in the differential mode to the transmission line that connects the LD-Driver with the transmitter optical subassembly. The back terminator connects one of output terminals with the other output terminals, and includes a pair of circuit blocks and a passive device. Each of the circuit blocks is connected to the output terminal and includes a series circuit of an active device and a current source that provides a bias current to the active device. The passive device connects the circuit blocks.

The active device in the circuit blocks may be a bipolar transistor whose collector is connected to the output terminal and short-circuited with the base thereof. The bipolar transistor is biased by the current source connected between the emitter thereof and the ground. The active device may be a diode whose anode is connected to the output terminal, while, the cathode thereof is grounded through the current source. The passive device is coupled between the emitter of the bipolar transistors or the diodes in respective circuit blocks.

The back terminator of the present invention may further provide another passive device directly connected between the output terminals of the LD-Driver. The impedance of the other passive device is at least ten times greater than the impedance of the transmitter optical subassembly.

Another aspect of the present invention relates to an optical transmitter that provides the LD-Driver, a transmitter optical subassembly implementing the LD and a transmission line connecting the LD-Driver with the transmitter optical subassembly. The LD-Driver of the present invention provides the driving current to the LD provided in the transmitter optical subassembly; and comprises a pair of output terminals and a back terminator. Each of the output terminals outputs the driving current in the differential mode to the transmission line. The back terminator connects one of the output terminals with the other output terminals, and includes a pair of circuit blocks and a passive device. Each of the circuit blocks is connected to the output terminal and includes a series circuit of an active device and a current source that provides a bias current to the active device. The passive device connects the circuit blocks.

BRIEF DESCRIPTION OF DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS

Next, preferred embodiments according to the present invention will be described as referring to accompanying drawings. In the description of the drawings, the same elements will be referred by the same numerals or the symbols without overlapping explanations.

Figure 1:
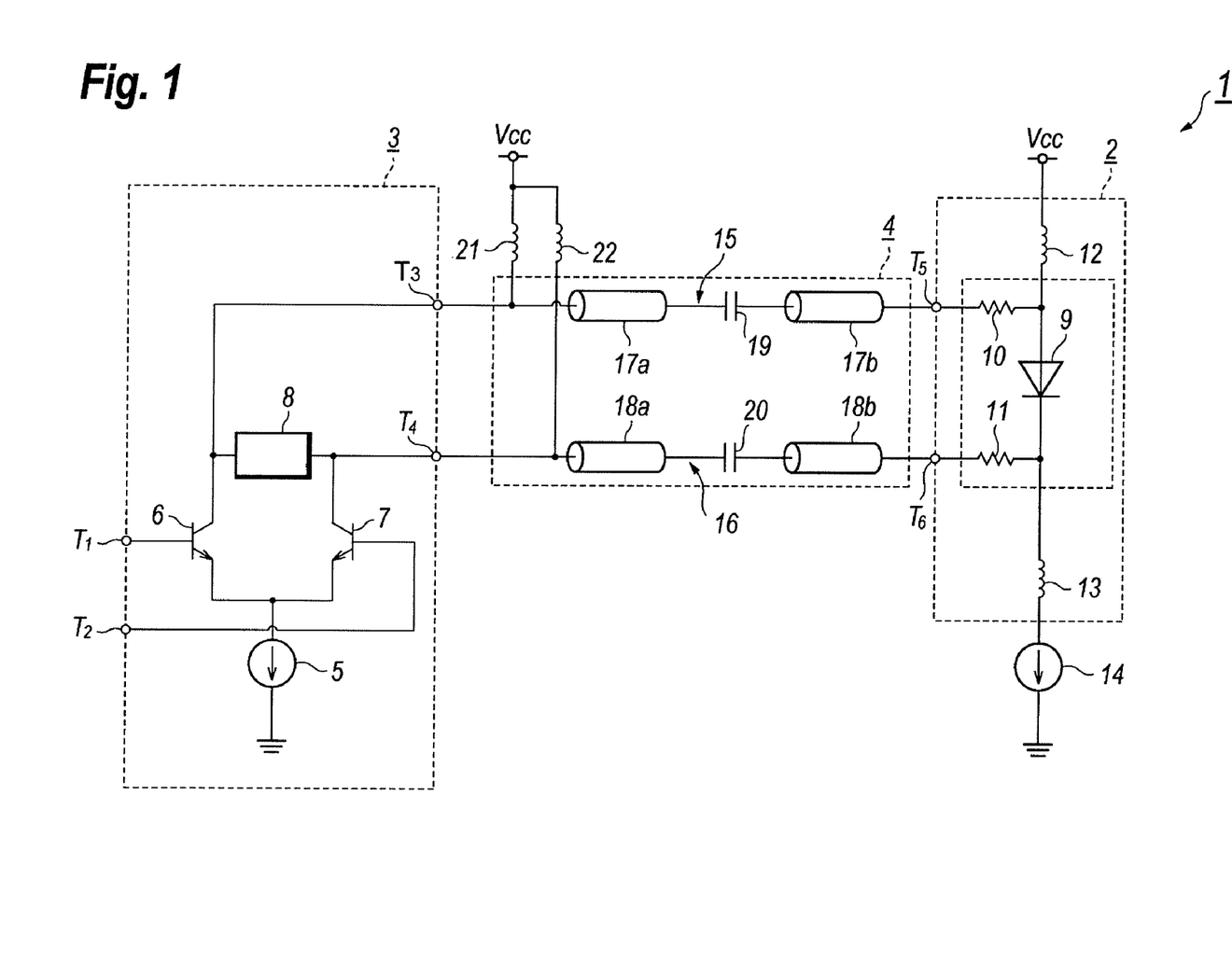
FIG. 1 is a circuit diagram of the optical transmitter according to an embodiment of the present invention.

FIG. 1 is a circuit diagram of an optical transmitter 1 according to the first embodiment of the present invention. The optical transmitter 1 is an apparatus to generate an optical signal corresponding to the data to be transmitted in the optical communication system, and includes a transmitter optical subassembly 2 (hereafter denoted as TOSA), a LD-Driver 3, and a transmission network 4 that couples the LD-driver 3 with the TOSA 2.

The data to be transmitted is provided in the input terminals, $T_1$ and $T_2$, as the configuration of the differential signals, $Tx_N$ and $Tx_P$, respectively. Two transistors, 6 and 7, which constitutes a differential circuit with a modulation current source 5, each receives the data provided in the input terminals, $T_1$ and $T_2$. These two transistors, 6 and 7, are the type of the npn-transistor with the base connected to each input terminal, $T_1$ or $T_2$, commonly connected emitters are grounded through the current source 5, and the collectors are connected to the respective output terminal, $T_3$ or $T_4$. Switching the transistors, 6 and 7, by the differential input data, the LD-Driver 3 may generate the modulation current in the output terminals, $T_3$ and $T_4$, which is provided to the TOSA 2.

In the present embodiment, the LD-Driver 3 provides a back terminator 8 between two output terminals, $T_3$ and $T_4$. The back terminator 8 may prevent the signal transmitting in the transmission network 4 from being reflected at the output terminals, $T_3$ and $T_4$, toward the TOSA 2. Details of the back terminator 8 will be described later.

The TOSA 2 includes an LD 9, two resistors, 10 and 11, and two inductors, 12 and 13. Specifically, these devices are enclosed within a package whose outer shape has, for instance, a TO-CAN type and/or a butterfly type. The TOSA 2 provides two input terminals, $T_5$ and $T_6$, one of which $T_5$ is connected with the anode of the LD 9 through one of resistors 10, while, the other $T_6$ is connected with the cathode of the LD 9 through the other of the resistors 11. The LD 9 may emit signal light by being provided with the driving current of the differential mode through the input terminals, $T_5$ and $T_6$.

The input impedance $Z_L$ of the TOSA 2 viewed from the transmission line 4 is given by:

$$Z_L = R_{LD} + Rdp + Rdn, \quad (1)$$

where $R_{LD}$ is a differential resistance of the LD 9; and Rdp and Rdn are the resistance of the resistors, 10 and 11, respectively.

The LD 9 is biased by the power supply Vcc through the inductor 12 and is provided with the bias current from the current source 14 through the other inductor 13. The TOSA 2 may have another arrangement where the bias current source 14 is connected between the power supply Vcc and the inductor 12, while, the cathode of the LD 9 is grounded through the other inductor 13.

The optical transmitter 1 according to the present embodiment further provides two transmission lines, 15 and 16, in the transmission network 4 that electrically couple the LD-Driver 3 with the TOSA 2. One of the transmission lines 15 includes a transmission line 17a in the LD-Driver side, another transmission line 17b in the TOSA side and a coupling capacitor 19 connecting these two transmission lines, 17a and 17b. While, the other transmission line 16 provides two lines, 18a and 18b, and a coupling capacitor 20 connecting two lines, 18a and 18b. Thus, two capacitors, 19 and 20, may cut the DC component contained in the driving signal.

The optical transmitter 1 according to the present embodiment still further provides two inductors each connected to the output terminals, $T_3$ and $T_4$, of the LD-Driver 3. The output terminals, $T_3$ and $T_4$, that is, the collector of the transistors, 7 and 8, in the differential circuit are biased by the power supply Vcc through these inductors, 21 and 22.

The characteristic impedance $Z_0$ of the transmission lines, 17a to 18b, are matched with the input impedance $Z_L$ of the TOSA 2 or the output impedance $Z_{OUT}$ of the LD-Driver 3; then, the signal reflection due to the impedance mismatching between the transmission line and the input impedance $Z_L$ of the TOSA 2, or the mismatching between the transmission line and the output impedance $Z_{OUT}$ of the LD-Driver 3 may be substantially prevented. However, because the LD 9 inherently accompanies with capacitive components such as the junction capacitance connected in parallel to the differential resistor of the LD 9 or the parasitic inductance inherently accompanied with the bonding wires between the electrodes of the LD 9 and the terminal of the resistors, 10 and 11, the input impedance $Z_L$ of the TOSA 2 decreases or increases in a high frequency region, which causes a substantial signal reflection unable to be compensated by the transmission impedance and the output impedance $Z_{OUT}$ of the LD-Driver 3. The back terminator 8 provided in the LD-Driver 3 may have a function to absorb the signal reflection which is left in the high frequency region and travels from the TOSA 2 to the LD-Driver 3.

Figure 2:
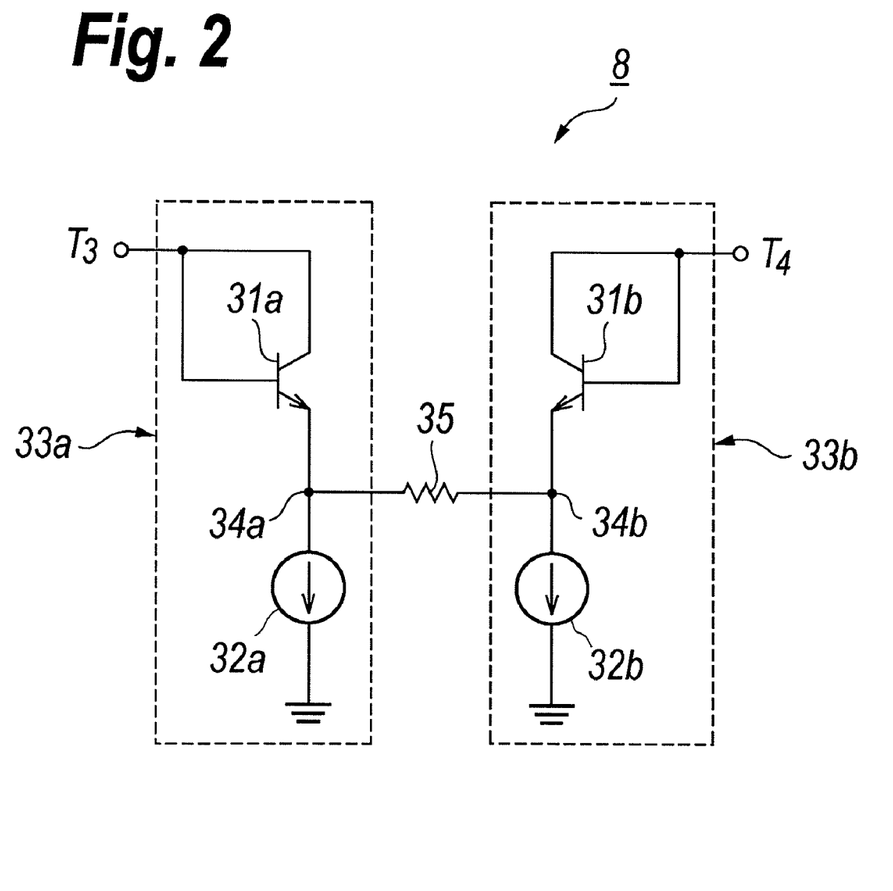
FIG. 2 is a circuit diagram of the back terminator according to the first embodiment of the present invention.

FIG. 2 illustrates a circuit diagram of the back terminator 8 according to an embodiment of the present invention. Although a conventional terminator that connects the output terminals, $T_3$ and $T_4$, only by a resistor with relatively smaller resistance may show a terminating function, it increases the power consumption of the LD-Driver 3 because a portion of the modulation current flows in this terminating resistor. The back terminator 8 according to the present embodiment provides a transistor as an active device in addition to a resistor connecting the output terminals, $T_3$ and $T_4$, as a passive device as shown in FIG. 2.

Specifically, the back terminator 8 provides two circuit blocks, 33a and 33b, each including a transistor, 31a or 31b, and a current source, 32a or 32b, connected in series to the transistor, 31a or 31b; and a first resistor 35 as the passive device with resistance Rebt connecting two blocks. The transistors, 31a and 31b, may be a bipolar transistor with short-circuited collector and base to form an equivalent diode between the output terminal, $T_3$ or $T_4$, and the emitter which is grounded through the current source, 32a or 32b. The first resistor 35 are connected between intermediate nodes, 34a and 34b, of respective circuit blocks, 33a and 33b, which shows a function to connect the emitter of the transistor 31a to the current source 32b in the other blocks, while it connects the emitter of the other transistor 31b to the current source 32a. Thus, each transistor, 31a or 31b, is biased by two current sources, 32a and 32b.

The differential resistance between the collector and the emitter of the transistor, 31a or 31b, is given by an inverse of the trans-conductance gm of the transistor. Assuming $gm_0$ is the trans-conductance of the transistor at a condition where the output terminal, $T_3$ and $T_4$, are in the equal potential, which is equivalent to a condition where the collector current of the transistors, 31a and 31b, are equal; the impedance $Z_{BT}$ between the output terminals, $T_3$ and $T_4$, becomes:

$$Z_{BT} = Rebt + 2/gm_0 \quad (2)$$

Because the trans-conductance $gm_0$ of the transistor, 31a and 31b, is given by:

$$gm_0 = Ic/Vt = Ic \cdot q/kT, \quad (3)$$

where Vt is given by kT/q (k: Boltzmann constant, T: absolute temperature (Kelvin), q: charge), the trans-conductance is inversely proportional to the absolute temperature T. For instance, when the temperature of the transistors, 31a and 31b, is 27° C. and the collector current Ic is 1 mA, the differential resistance of the transistor, which is equal to the inverse of the trans-conductance $gm_0$, becomes $1/gm_0 = 26\Omega$. Accordingly, applying a circuit whose output current is proportional to the absolute temperature to the current sources, 32a and 32b, so as to cancel the temperature dependence of the trans-conductance of the transistors, 31a and 31b, a resistor without any temperature dependence may be obtained.

Setting the resistance of the first resistor 35 to be 75Ω, the impedance of one of the transmission line viewed from the other transmission line, which is equivalent to the resistance between two output terminals, $T_3$ and $T_4$, may be about 100Ω by flowing a current of a few milli-amperes in the transistors, 31a and 31b. Thus, the back terminator with the predetermined impedance may be available. Moreover, the back terminator 8 is one type of the active termination without generating any replica signal, which easily enables to lower the power supply voltage and to make the driving current smaller.

The transistors, 31a and 31b, forms one type of differential circuits with the emitter feedback by the first resistor 35. The impedance $Z_{BT}$ between the output terminals, $T_3$ and $T_4$, may be kept constant only for conditions where the voltage difference between the terminals, $T_3$ and $T_4$, is less than a few hundreds milli-volt due to the emitter feedback through the first resistor 35. However, when the voltage difference between the output terminals, $T_3$ and $T_4$, becomes large; one of the transistors, 31a and 31b, turns off. For instance, when the output terminals $T_4$ becomes small enough compared with the other terminals $T_3$ such that the currents provided from both current sources, 32a and 32b, flow only in the transistor 31a; accordingly, the voltage between the base and the emitter $V_{BE}$ of the transistor 31b, which is equivalent to the forward bias of the diode, becomes close to zero, which makes the equivalent resistance of the diode large enough. In such a case, the impedance between the output terminals, $T_3$ and $T_4$, becomes large in the DC mode or in a relatively lower frequency region, but the capacitance inherently accompanied with between the base and the emitter of the transistor may lower the impedance at a higher frequency region, which shows a certain amount of the back termination effect.

A back terminator only using passive elements, which is disclosed in "Broadband Circuits for Optical Fiber Communication" by E. Sackinger, Wiley-Inter Science, published on Mar. 11, 2005, page 273, is generally required to use resistors $R_{BT}$ with the resistance of 25Ω or 50Ω and flows a portion of the modulation current therein in spite of the function to suppress the degradation of the optical output by preventing the multiple reflection of the electrical signal transmitting between the LD-Driver and the LD, which increases the power consumption of the LD-Driver. When the TOSA 3 has greater input impedance $Z_L$, for instance 25 to 50Ω, to reduce the influence of the parasitic inductance of the bonding wire, the passive back terminator $R_{BT}$ has the resistance equal to or, occasionally smaller than the input impedance $Z_L$ of the TOSA 3, which means that the current, whose magnitude is equal to or greater than the driving current for the LD, flows in the back terminator, which considerably increases the power consumption of the LD-Driver. The back terminator 8 according to the present embodiment may set the current of only a few milli-amperes by the existence of the current sources, 32a and 32b, and the active transistors, 31a and 31b, with the diode connection. Moreover, the back terminator 8 is unnecessary to form any replica signal, which may easily lower the supply voltage Vcc.

Figure 3:
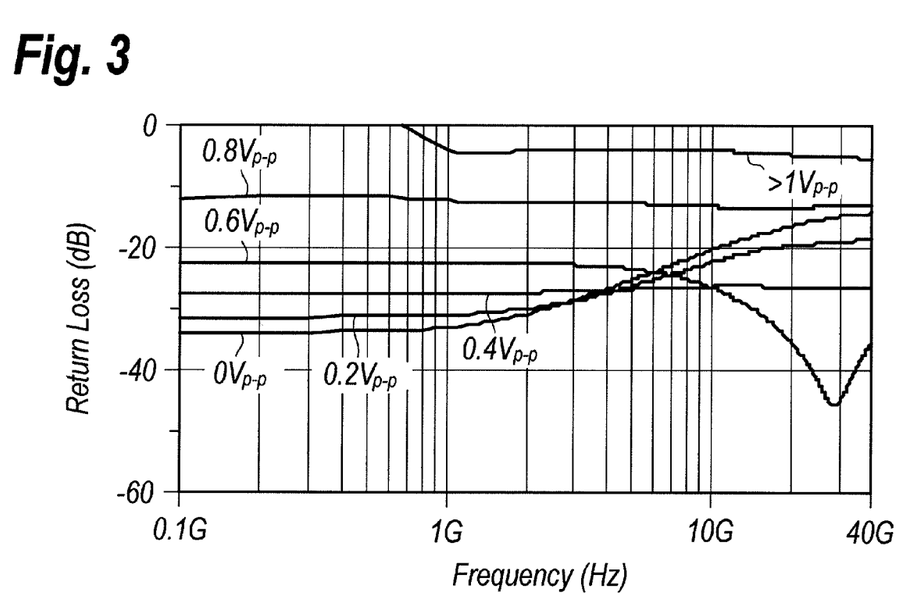
FIG. 3 shows the return loss observed in the output terminals of the LD-Driver providing the back terminator according to the first embodiment shown in FIG. 2 when the differential amplitude of the driving signal varies.

FIG. 3 shows frequency behaviors of the return loss when the voltage between the output terminals varies. The return loss shown in FIG. 3 in the unit of decibel [dB] corresponds to the reflection from the LD-Driver 3 to the transmission lines 4. FIG. 3 shows an excellent return loss performance in a wider frequency range less than −10 dB for the differential amplitude between 0.2 $V_{p-p}$ to 0.8 $V_{p-p}$. For the differential voltage over 1 $V_{p-p}$, the return loss less than −6 dB may be secured for frequencies over 1 GHz, which reflects the function of the parasitic capacitance inherently accompanied between the base and the emitter of the transistors, 31a and 31b, to bypass the transistor that is turned off by a large differential input in high frequencies.

Figure 4:
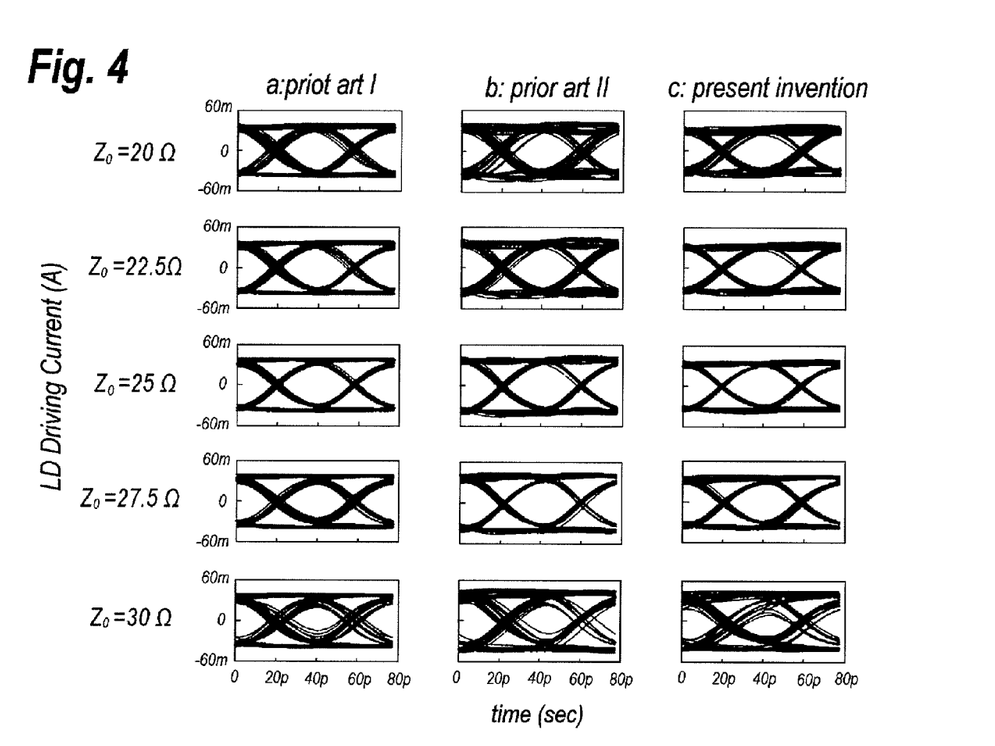
FIG. 4 shows waveforms of the driving signals, in which column "a" corresponds to a condition where the LD-Driver provides a conventional back terminator, column "b" is results for the LD-Driver without a back terminator, and column "c" corresponds to the LD-Driver according to the present embodiment.

FIG. 4 shows calculative results of the driving current for the LD. The column "a" reflects the results for the Sackinger's circuit mentioned above, the column "b" corresponds to an LD-Driver without any back terminator, and the column "c" shows results of the present embodiment. The calculation was done under the following assumptions: the data transmission speed of 25 Gbps, the modulation current for the LD of 80 mA, the conventional back terminator has the resistance of $R_{BT}$=50Ω, the input impedance of the TOSA of $Z_L$=25Ω including the differential resistance of the LD, and the characteristic impedance of the transmission lines of $Z_0$=25Ω.

Comparing the columns "a" and "c", the back terminator 8 according to the present embodiment may show a substantially same function with the Sackinger's circuit to suppress the degradation of the quality of the driving current. Note that the Sackinger's back terminator flows a half of the driving current, 40 mA, in the resistor of the back terminator, while, the present embodiment adds only a few milli-amperes, 4 to 6 mA, for the back terminator 8 to attain the function substantially same with those of the conventional back terminator. Without the back terminator 8 shown in the column "b", the glaring degradation was observed when the output impedance $Z_{OUT}$ deviates from the characteristic impedance $Z_0$ of the transmission line.

Figure 5:
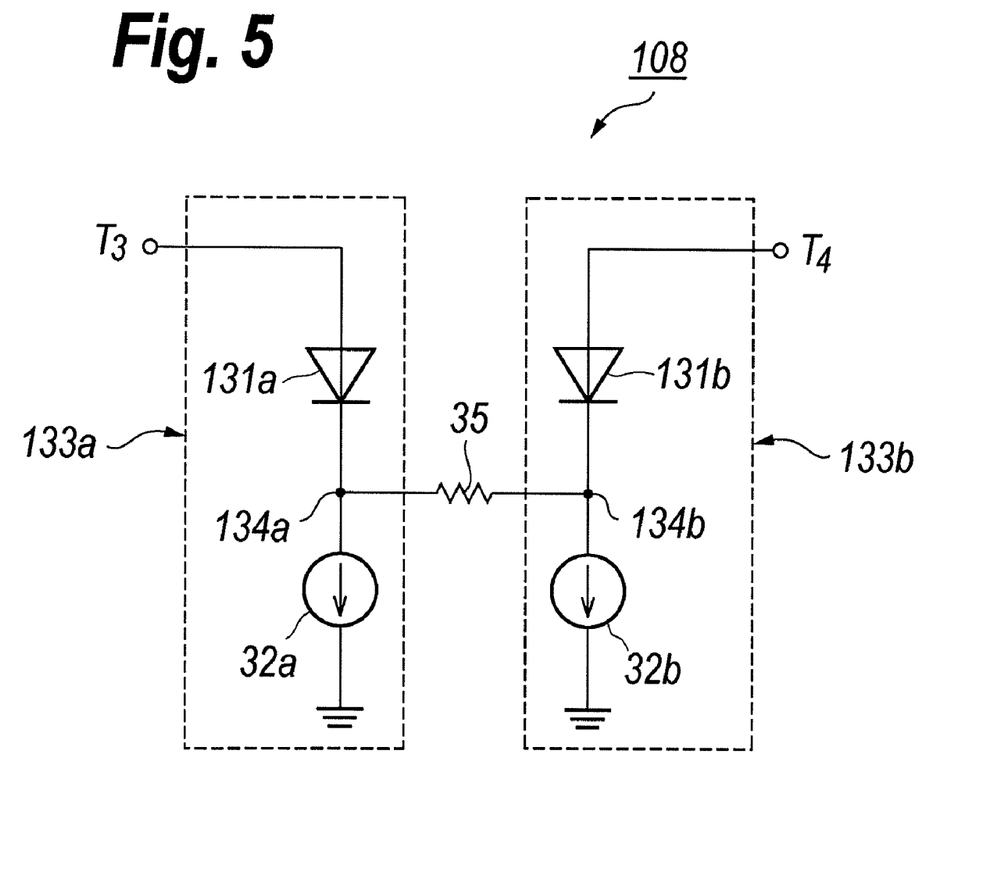
FIG. 5 is a circuit diagram of the back terminator according to the second embodiment of the present invention.

While there has been illustrated and described what are presently considered to be example embodiments of the present invention, it will be understood by those skilled in the art that various other modifications may be made, and equivalents may be substituted, without departing from the true scope of the invention. For instance, as illustrated in FIG. 5, two diodes, 131a and 131b, may be replaced with the transistors, 31a and 31b, shown in FIG. 2 with the diode connection. The current sources, 32a and 32b, may bias the diodes, 131a and 131b, by a few milli-amperes.

Figure 6:
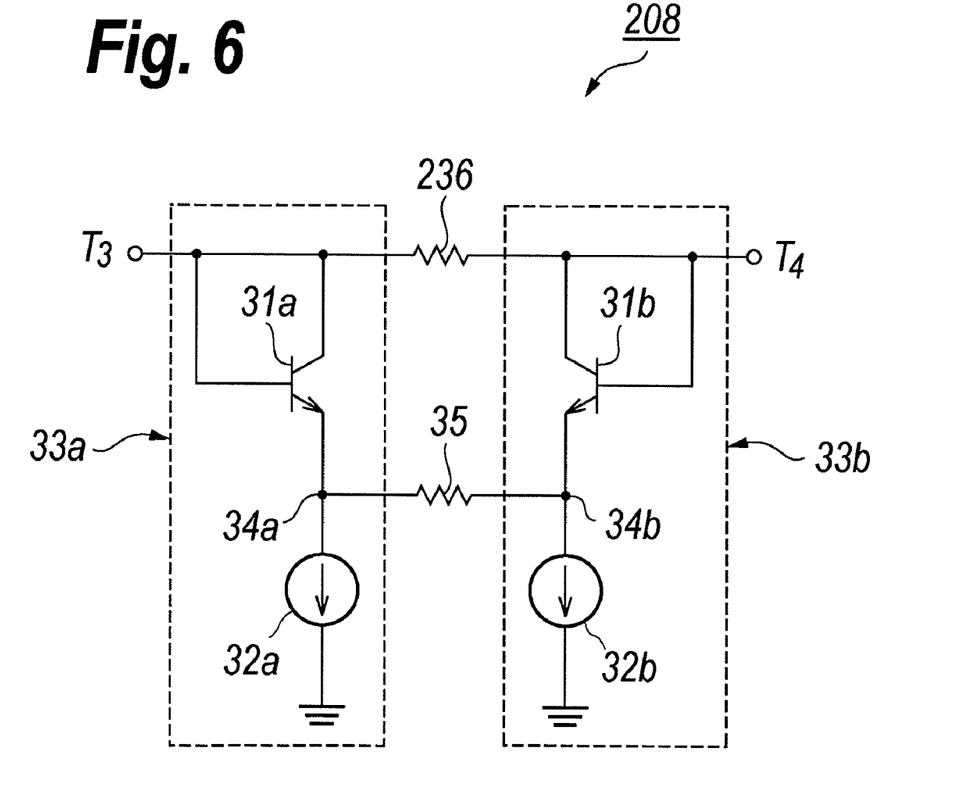
FIG. 6 is a circuit diagram of the back terminator according to the third embodiment of the present invention.

FIG. 6 shows still another back terminator 208 according to one embodiment of the invention. This back terminator 208 provides another resistor between two blocks, 33a and 33b, in addition to the first resistor 35, that is, the other resistor as a passive element directly connects one of the output terminals to the others. The additional resistor 236 may reduce the output impedance in a lower frequency region even when one of the transistors, 31a or 31b, turns off due to a large voltage difference between the output terminals, $T_3$ and $T_4$. The additional resistor 246 preferably has the resistance ten times, or more, greater than the input impedance $Z_L$ of the TOSA so as not to increase the power consumption of the LD-Driver 3.

Figure 7:
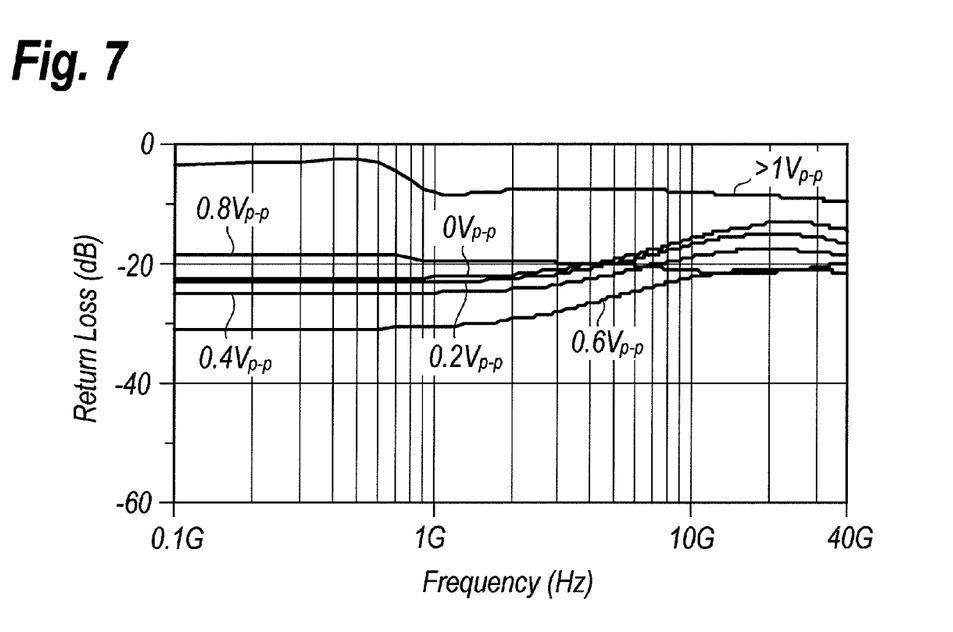
FIG. 7 shows the return loss observed in the output terminals of the LD-Driver that provides the back termination circuit shown in FIG. 6.

FIG. 7 shows frequency behaviors of the driving current supplied to the TOSA 2 when the LD-Driver 3 provides the back terminator 208 shown in FIG. 6, where the differential amplitude of the driving current varies in similar to the behaviors shown in FIG. 3. The resistance of the additional resistor 256 is set to be ten times greater than the input impedance $Z_L$ of the TOSA, that is, the resistor 256 has the resistance of 500Ω. The return loss shown in FIG. 7 is not as good as those shown in FIG. 3 for the differential voltage from 0 to 0.8 $V_{p-p}$, but the return loss for the differential voltage greater than 1 $V_{p-p}$ may be reduced to about −10 dB in a higher frequency region and less than 0 dB even in frequencies lower than 1 GHz.

The current source, 32a and 32b, in respective embodiments of the back terminator, 8, 108, and 208, may have a function that the output current thereof is variable. The variable current source may adjust the output impedance $Z_{OUT}$ of the LD-Driver 3, as configured by the equations (2) and (3). Furthermore, the resistor 35 and/or the other resistor 236 in FIG. 6 each connecting two blocks, 33a and 33b, may be replaced with impedance elements that vary the frequency response of the output impedance $Z_{OUT}$ of the LD-Driver 3. Because the devices implemented within the TOSA 2, such as the LD 9, inherently have impedance components, the signal reflection occurred at the input of the TOSA 2 shows the frequency dependence. The impedance elements connecting two blocks, 33a and 33b, may compensate those frequency dependence.

I claim:

1. A laser diode driver that provides a driving current to a semiconductor laser diode enclosed in a transmitter optical subassembly, comprising:
    a pair of output terminals each outputting said driving current in a differential mode to a transmission line connecting said laser diode driver with said transmitter optical subassembly; and
    a back terminator provided between said output terminals, said back terminator comprising a pair of circuit blocks and a passive device, each circuit block being connected to one of said output terminals and including a series circuit of an active device and a current source to provide a bias current to said active device, said passive device connecting said circuit blocks,
    wherein said active device in each said circuit block is a bipolar transistor whose collector and base are short-circuited to operate as a forwardly biased diode.

2. The laser diode driver of claim 1, wherein said current source in said circuit block is a variable current source.

3. The laser diode driver of claim 1, wherein said back terminator further provides an additional passive device directly connecting said output terminals of said laser diode driver.

4. The laser diode driver of claim 3, wherein said additional passive device has an impedance at least ten times greater than an input impedance of said transmitter optical subassembly.

5. The laser diode driver of claim 1, wherein said back terminator has an impedance substantially equal to twice a characteristic impedance of said transmission line.

6. The laser diode driver of claim 5, wherein said active device has an impedance substantially equal to half of a characteristic impedance of said transmission line, subtracted by an impedance of said passive device.

7. An optical transmitter, comprising:
    a transmitter optical subassembly that includes a semiconductor laser diode to emit signal light by being provided with a driving current;
    a pair of transmission lines each connected to said transmitter optical subassembly; and
    a laser diode driver to provide said driving current in a differential mode to said transmission lines, said laser diode driver providing a pair of output terminals each coupled with one of said transmission lines and a back terminator provided between said output terminals, said back terminator comprising a pair of circuit blocks and a passive device, each circuit block being connected to one of said output terminals and including a series circuit of an active device and a current source to provide a bias current to said active device, said passive device connecting said circuit blocks,
    wherein said active device in said circuit block is a bipolar transistor whose collector and base are short-circuited to operate as a forwardly biased diode.

8. The laser diode driver of claim 7, wherein said current source in said circuit block is a variable current source.

9. The laser diode driver of claim 7,
    wherein said back terminator further provides an additional passive device directly connecting said output terminals of said laser diode driver.

10. The laser diode driver of claim 9, wherein said additional passive device has an impedance at least ten times greater than an input impedance of said transmitter optical subassembly.

11. The laser diode driver of claim 7, wherein said back terminator has an impedance substantially equal to twice a characteristic impedance of said transmission line.

12. The laser diode driver of claim 11,
    wherein said active device has an impedance substantially equal to half a characteristic impedance of said transmission line; subtracted by an impedance of said passive device.

13. A laser diode driver that provides a driving current to a semiconductor laser diode enclosed in a transmitter optical subassembly, comprising:
    a pair of output terminals each outputting said driving current in a differential mode to a transmission line connecting said laser diode driver with said transmitter optical subassembly; and
    a back terminator provided between said output terminals, said back terminator comprising a pair of circuit blocks and a passive device, each circuit block being connected to one of said output terminals and including a series circuit of an active device and a current source to provide a bias current to said active device, said passive device connecting said circuit blocks,
    wherein said back terminator further includes an additional passive device directly connecting said output terminals of said laser diode driver.

14. The laser diode driver of claim 13,
    wherein said additional passive device has an impedance at least ten times greater than an input impedance of said transmitter optical subassembly.

15. An optical transmitter, comprising:
    a transmitter optical subassembly that includes a semiconductor laser diode to emit signal light by being provided with a driving current;
    a pair of transmission lines each connected to said transmitter optical subassembly; and
    a laser diode driver to provide said driving current in a differential mode to said transmission lines, said laser diode driver providing a pair of output terminals each coupled with one of said transmission lines and a back terminator provided between said output terminals, said back terminator comprising a pair of circuit blocks and a passive device, each circuit block being connected to one of said output terminals and including a series circuit of an active device and a current source to provide a bias current to said active device, said passive device connecting said circuit blocks,
    wherein said back terminator further includes an additional passive device directly connecting said output terminals of said laser diode driver.

16. The laser diode driver of claim 15,
    wherein said additional passive device has an impedance at least ten times greater than an input impedance of said transmitter optical subassembly.

* * * * *